(12) United States Patent
Honda et al.

(10) Patent No.: US 10,419,071 B2
(45) Date of Patent: Sep. 17, 2019

(54) RINGING SUPPRESSION CIRCUIT

(71) Applicant: DENSO CORPORATION, Kariya, Aichi-pref. (JP)

(72) Inventors: Takuya Honda, Kariya (JP); Hirofumi Isomura, Kariya (JP); Tomohisa Kishigami, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 16/252,793

(22) Filed: Jan. 21, 2019

(65) Prior Publication Data

US 2019/0158143 A1   May 23, 2019

Related U.S. Application Data

(63) Continuation of application No. PCT/JP2017/018188, filed on May 15, 2017.

(30) Foreign Application Priority Data

Jul. 29, 2016   (JP) .................................. 2016-149794

(51) Int. Cl.
*H04B 3/00* (2006.01)
*H04B 3/42* (2006.01)
*H03K 19/0175* (2006.01)
*H03K 19/0185* (2006.01)
*H04B 3/02* (2006.01)
*H04L 25/02* (2006.01)
*H03K 5/1252* (2006.01)
*H03K 17/687* (2006.01)

(52) U.S. Cl.
CPC ............. *H04B 3/42* (2013.01); *H03K 5/1252* (2013.01); *H03K 19/0175* (2013.01); *H03K 19/0185* (2013.01); *H04B 3/02* (2013.01); *H04L 25/02* (2013.01); *H03K 17/687* (2013.01)

(58) Field of Classification Search
CPC .......... H04B 3/42; H04B 3/02; H03K 5/1252; H03K 19/0185; H03K 19/0175; H03K 17/687; H04L 25/02
USPC ........................................................ 375/257
See application file for complete search history.

(56) References Cited

U.S. PATENT DOCUMENTS

| 6,768,334 B1 | 7/2004 | Yamauchi et al. |
| 6,992,537 B2 | 1/2006 | Yasui et al. |
| 8,593,202 B2 | 11/2013 | Mori et al. |

(Continued)

FOREIGN PATENT DOCUMENTS

| JP | 2009-253498 A | 10/2009 |
| JP | 4767025 B2 | 9/2011 |

*Primary Examiner* — Don N Vo
(74) *Attorney, Agent, or Firm* — Posz Law Group, PLC

(57) ABSTRACT

A ringing suppression circuit is provided at a node having a communication circuit executing communication with another node by transmitting a differential signal through a pair of communication lines. The ringing suppression circuit includes: a suppressor configured to perform a suppression operation to suppress ringing occurred with a transmission of the differential signal by connecting a resistive component between the pair of communication lines; and a reference potential provider configured to provide a reference potential, which corresponds to a midpoint potential of the pair of communication lines during a steady state, to an intermediate point of the resistive component.

8 Claims, 10 Drawing Sheets

(56) References Cited

U.S. PATENT DOCUMENTS

2002/0005744 A1* 1/2002 Forbes ............. H03K 3/356113
　　　　　　　　　　　　　　　　　　　327/215
2010/0177829 A1* 7/2010 Suzuki ................. H01L 27/092
　　　　　　　　　　　　　　　　　　　375/257
2019/0097681 A1* 3/2019 Honda .................... H04B 3/42

* cited by examiner

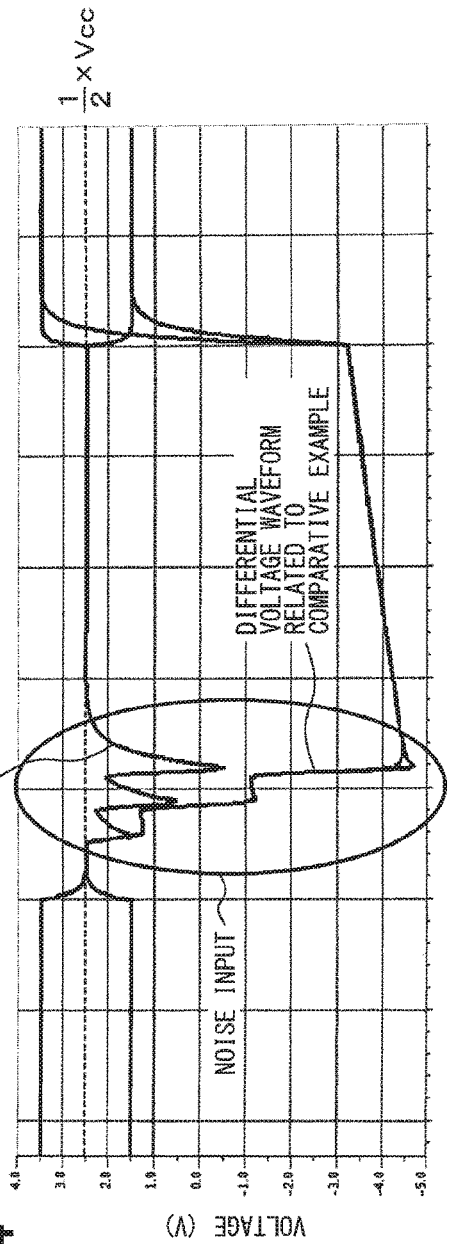
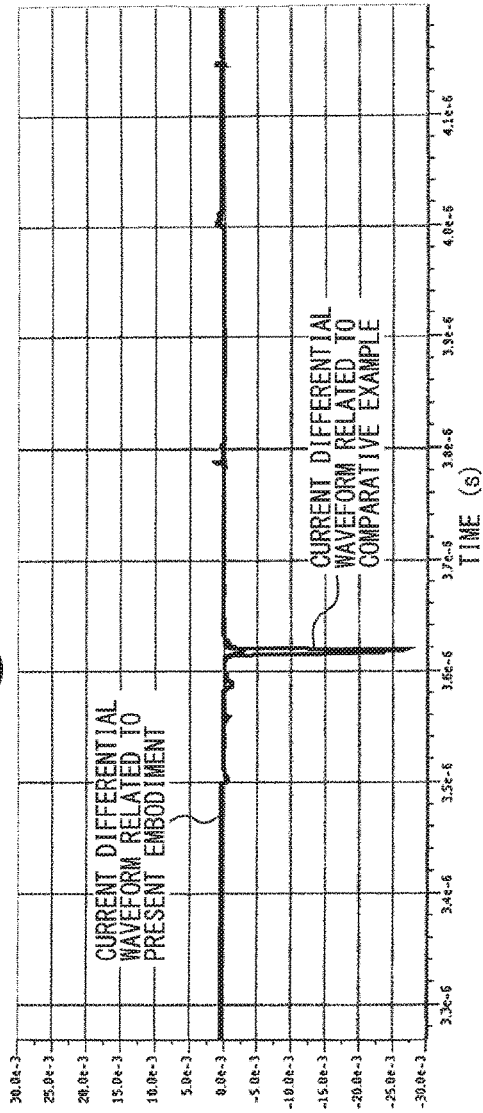
FIG. 4

RINGING SUPPRESSION CIRCUIT

CROSS REFERENCE TO RELATED APPLICATIONS

The present application is a continuation application of International Patent Application No. PCT/JP2017/018188 filed on May 15, 2017, which designated the U.S. and claims the benefit of priority from Japanese Patent Application No. 2016-149794 filed on Jul. 29, 2016. The entire disclosures of all of the above applications are incorporated herein by reference.

TECHNICAL FIELD

The present disclosure relates to a ringing suppression circuit.

BACKGROUND

When transmitting a digital signal via a transmission line configured by a pair of communication lines, a part of a signal energy may be reflected when a signal level changes at a receiving end, and waveform distortion such as overshoot or undershoot, that is, ringing may occur in the signal. A variety of techniques have been proposed for suppressing the waveform distortion.

SUMMARY

The present disclosure relates to a ringing suppression circuit for suppressing ringing caused by the transmission of a differential signal through a pair of communication lines.

BRIEF DESCRIPTION OF DRAWINGS

The above and other objects, features and advantages of the present disclosure will become more apparent from the following detailed description made with reference to the accompanying drawings, in which:

FIG. 4 is a drawing that illustrates the respective waveforms of differential signals and the respective waveforms of current differences as the simulation results respectively related to the operation of a ringing suppression circuit according to the first embodiment and the operation of the ringing suppression circuit according to a comparative example;

DETAILED DESCRIPTION

Figure 1:
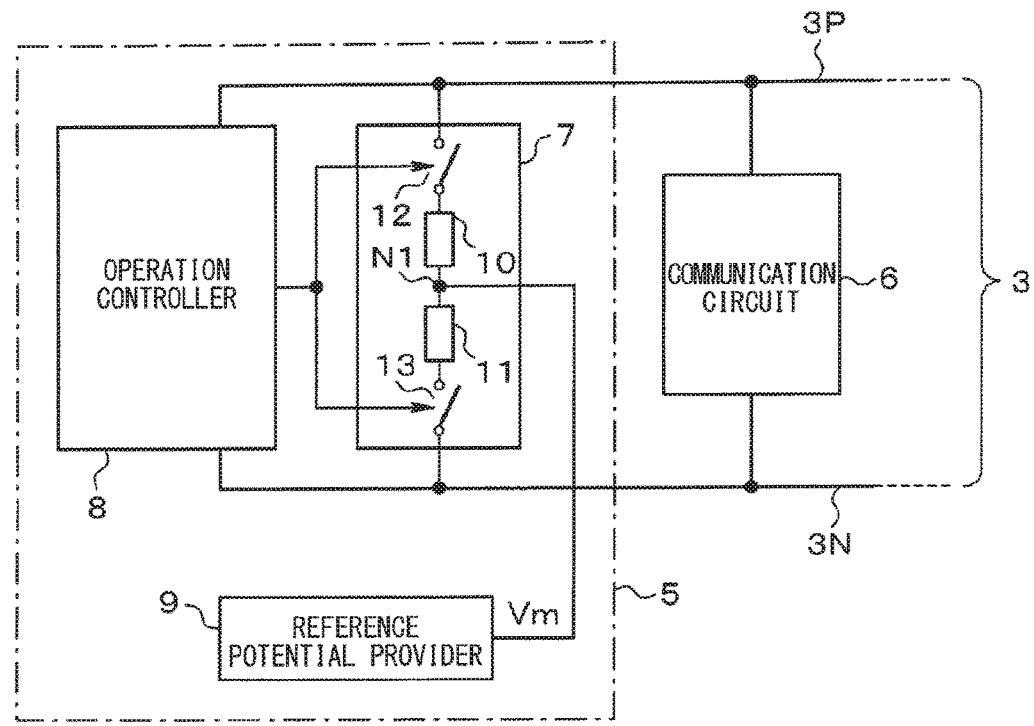
FIG. 1 is a drawing that schematically illustrates a configuration of a ringing suppression circuit according to a first embodiment.

For example, a ringing suppression circuit may be configured with a simpler structure to suppress ringing for enhancing the communication fidelity. For this ringing suppression circuit, a switching device is provided in a communication bus and is configured to be turned on with a predetermined time period when a change in a signal's level is detected.

With regard to the ringing suppression circuit as described above, the suppression operation for suppressing the ringing is performed by lowering the impedance in the communication bus through the on-resistance of a MOSFET as a switching device. With such an operation is performed, when common-mode noise is superimposed, the potential (midpoint potential) of a pair of communication lines gets unstable due to the influence of noise.

That is, when the suppression operation is performed, the resistive component is connected between a pair of the transmission lines. With regard to the general configuration as described above, when the common-mode noise is superimposed, the midpoint potential of a pair of the transmission lines gets unstable due to the influence of noise in the above-described situation.

According to an aspect of the present disclosure, a ringing suppression circuit is provided at a node having a communication circuit executing communication with another node by transmitting a differential signal through a pair of communication lines. The ringing suppression circuit includes: a suppressor configured to perform a suppression operation to suppress ringing occurred with a transmission of the differential signal by connecting a resistive component between the pair of communication lines; and a reference potential provider configured to provide a reference potential, which corresponds to a midpoint potential of the pair of communication lines during a steady state, to an intermediate point of the resistive component.

Thus, with such a configuration, the reference potential provider is configured to provide a reference potential corresponding to the midpoint potential of a pair of the transmission lines during the steady state to the intermediate point of the resistive component. When the common-mode noise is superimposed during the suppression operation, the midpoint potential of a pair of the transmission lines fluctuates; however, the reference potential is provided to the intermediate point of the resistive component so that the fluctuation is suppressed to a relatively smaller scale. Furthermore, in this case, the fluctuated midpoint potential of a pair of the transmission lines returns to the reference potential provided to the intermediate point of the resistive component, that is, the midpoint potential during the steady state within a relatively short time. According to the above-mentioned configuration, even when the common-mode noise is superposed during the suppression operation for ringing suppression, the potential of a pair of the communication lines can be stabilized.

Hereinafter, multiple embodiments will be described with reference to the drawings. Hereinafter, in the respective embodiments, substantially the same configurations are denoted by identical symbols, and repetitive description will be omitted.

First Embodiment

The following describes a first embodiment with reference to FIGS. 1 to 5.

Figure 2:
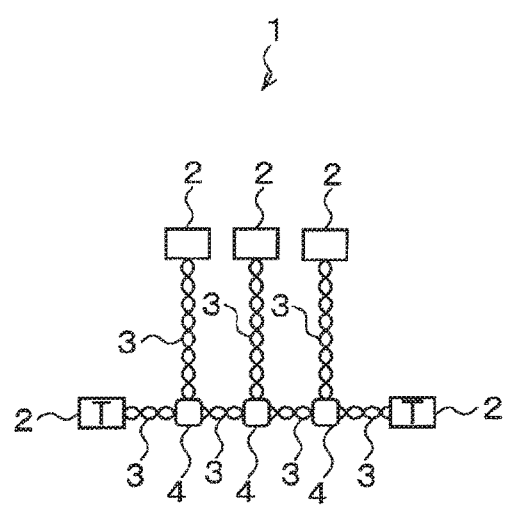
FIG. 2 is a drawing that schematically illustrates a configuration of communication network.

A communication network 1 illustrated in FIG. 2 refers to a network where a plurality of nodes 2 is connected through a transmission line 3, which is to be configured by a twisted-pair line, for controlling communication among the plurality of nodes 2 to be mounted to a vehicle. The plurality of nodes 2 each is an electronic control unit configured to control an actuator based on information sent from a sensor-like device or a sensor used to detect a vehicle state.

Each node 2 is provided with a communication circuit (not shown), and transmission data or receiving data is converted to a communication signal according to a communication protocol, for example, CAN protocol, at the transmission line 3. Each node 2 performs communication, in other words, transmitting or receiving data, with the other node 2. A branch connector 4 is provided at the midway of the transmission line 3, in other words, the communication bus. The branch connector 4 is configured to divide the transmission line 3 into several paths appropriately.

Among the plurality of nodes 2 illustrated in FIG. 2, the node 2 denoted as "T" in a rectangle refers to a node having a terminating resistance outside the node 2. Among the plurality of nodes 2 illustrated in FIG. 2, the node 2 without an indication in a rectangle refers to a node having no terminating resistance. In this case, the value of the terminating resistance is, for example, 120Ω.

A ringing suppression circuit 5 illustrated in FIG. 1 and communication circuit 6 configured to transmit and receive data are provided at the node 2 illustrated in FIG. 2. The ringing suppression circuit 5 includes a suppressor 7, an operation controller 8 and a reference potential provider 9. The suppressor 7 lowers the impedance of the transmission line 3 including a high-potential signal line 3P and a low-potential signal line 3N to perform a suppression operation for suppressing ringing caused by the transmission of a differential signal. The high-potential signal line 3P and the low-potential signal line 3N correspond to a pair of transmission lines (hereinafter referred to as signal lines 3P and 3N for simplicity in some occasions).

The suppressor 7 includes resistors 10 and 11 and switches 12 and 13. The switch 12, the resistors 10 and 11 and the switch 13 are connected in series in order between the signal lines 3P and 3N. The resistive ratio of the resistor 10 with respect to the resistor 11 is 1:1. The respective resistance values of the resistors 10 and 11 are set according to, for example, the characteristic impedance of the transmission line 3 or the length of the transmission line 3.

Since the switches 12 and 13 are to be controlled by the operation controller 8, the switches 12 and 13 are turned on when the suppression operation is performed, and the switches 12 and 13 are turned off when the suppression operation is not performed. When the switches 12 and 13 are turned on, the resistors 10 and 11 are connected between the signal lines 3P and 3N, and the impedance between the signal lines 3P and 3N (hereinafter referred to as "line impedance") is lowered. In this case, the line impedance is, for example, around 100 kΩ when the switches 12 and 13 are turned off. However, the line impedance is, for example, around 120Ω when the switches 12 and 13 are turned on.

The operation controller 8 controls the operation of the suppressor 7. In particular, when the operation controller 8 detects that the signal level of a differential signal is changed to a level indicated as a recessive level, the operation controller 8 controls the suppressor 7 to start the suppression operation by turning on the switches 12 and 13 in the suppressor 7. The reference potential provider 9 provides a reference potential Vm to a mutual connection node N1 between the resistors 10 and 11. The reference potential Vm corresponds to a midpoint potential of the signal lines 3P and 3N during a steady state.

In this case, the series circuit of the resistors 10 and 11 corresponds to a resistive component. The mutual connection node N1 between the resistors 10 and 11 corresponds to an intermediate point of the resistive component. In this case, the reference potential Vm is at the level, which is the same as the midpoint potential (for example, 2.5V) of the signal lines 3P and 3N during the steady state.

Figure 3:
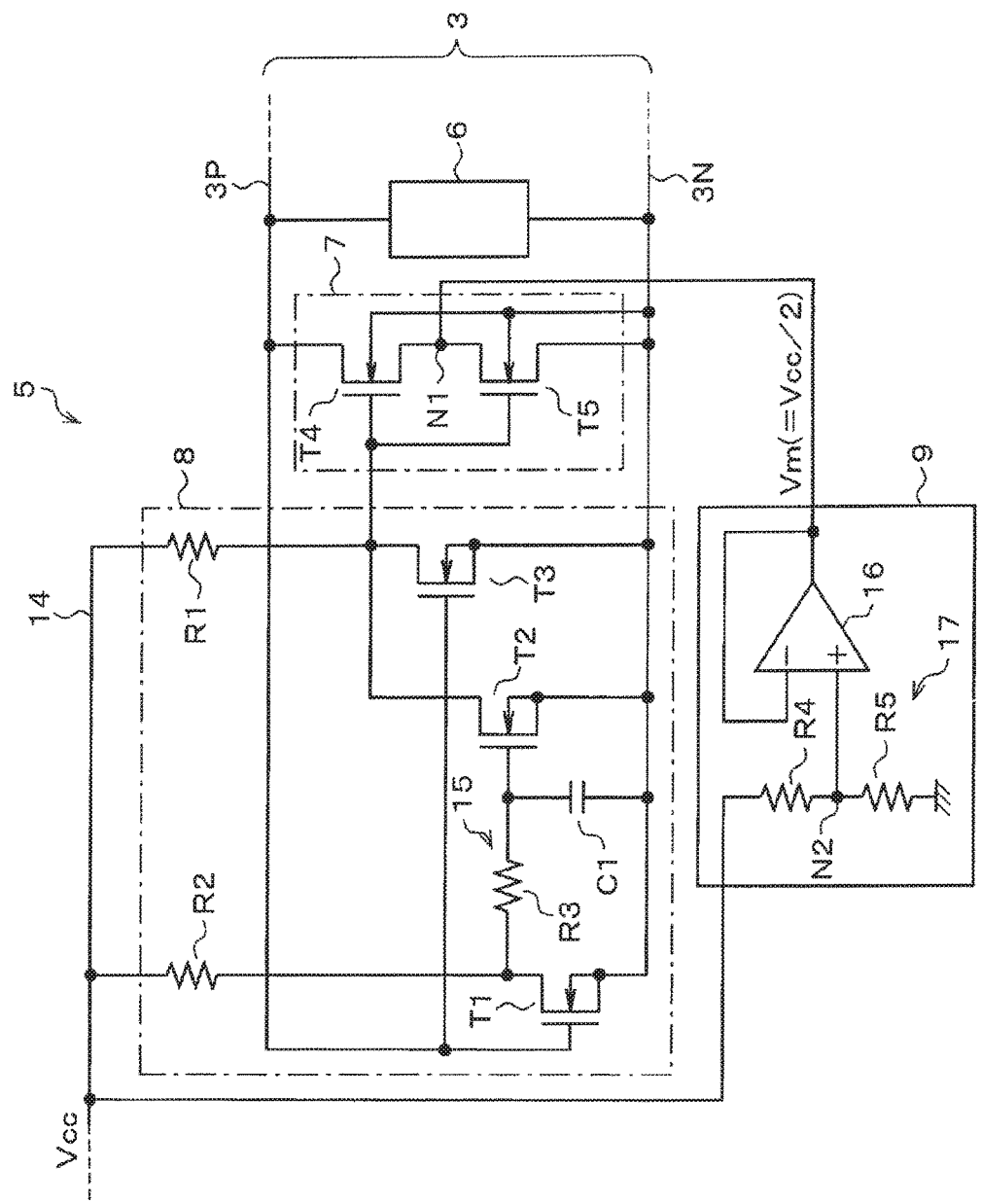
FIG. 3 is a drawing that schematically illustrates a particular configuration example of a ringing suppression circuit.

As a particular configuration of such a suppression circuit 5, a configuration as illustrated in FIG. 3 can be adopted, for example. As illustrated in FIG. 3, the ringing suppression circuit 5 and the communication circuit 6 are connected in parallel between the signal lines 3P and 3N. The ringing suppression circuit 5 includes transistors T1 to T5 as n-channel MOSFETs.

The respective sources of the transistors T1 to T3 are connected to the signal line 3N. The respective gates of the transistors T1, T3 are connected to the signal line 3P. The drains of the transistors T2, T3 are connected to the gates of the transistors T4 and T5, and are connected to a power supply line 14 through a resistor R1. The power supply line 14 is provided with a power supply Vcc (for example, 5V) for the operation of the ringing suppression circuit 5.

The drain of the transistor T1 is connected to the power supply line 14 through the resistor R2, and is connected to the gate of the transistor T2 through the resistor R3. The gate of the transistor T2 is connected to the signal line 3N through a capacitor C1. A resistor R3 and a capacitor C1 constitute an RC filter circuit 15.

The drain of the transistor T4 is connected to the signal line 3P, and the source of the transistor T4 is connected to the drain of the transistor T5. The source of the transistor T5 is connected to the signal line 3N. Both of the transistors T4 and T5 are connected in series between the signal lines 3P and 3N. The respective back-gates of the transistors T4 and T5 are connected to the signal line 3N. The mutual connection node N1 between the transistors T4 and T5 corresponds to the mutual connection node N1 illustrated in FIG. 1, and is connected to the output terminal of the reference potential provider 9.

In the configuration as described above, the suppressor 7 is configured by the transistors T4 and T5. In this case, the on-resistance of the transistor T4 and the on-resistance of the transistor T5 respectively function as the resistors 10 and 11. The switching operation performed by the transistor T4 and the switching operation performed by the transistor T5 respectively function as the switches 12 and 13. The value of the on-resistance of the transistor T4 and the value of the on-resistance of the transistor T5 are equal. The operation controller 8 is configured by the transistors T1 to T3, the resistors R1 to R3 and the capacitor C1.

The reference potential provider 9 includes resistors R4, R5 and an operational amplifier 16, which corresponds to a buffer circuit. The resistors R4 and R5 are connected in series between the power supply line 14 and a ground as a reference potential of the circuit. The resistors R4 and R5 constitute a dividing circuit 17 for dividing the power supply voltage Vcc. The resistivity ratio of the resistor R4 with respect to the resistor R5 is set to be 1:1. The mutual connection node N2 between the resistors R4 and R5 is connected to a non-inverting input terminal of the operational amplifier 16. An inverting input terminal of the operational amplifier 16 is connected to the output terminal of the operational amplifier 16.

In other words, the operational amplifier 16 constitutes a voltage follower circuit. The output terminal of the operational amplifier 16 is the output terminal of the reference potential Um. With such a configuration, the reference potential provider 9 is configured to provide a divided voltage (=Vcc/2) to the mutual connection node N1 between the transistors T4 and T5 through the voltage follower. The divided voltage is obtained by dividing the power supply voltage Vcc through the resistors R4 and R5. In this case, the reference potential Um to be provided to the mutual connection node N1 is 2.5V as a half of the power supply voltage Vcc that corresponds to a midpoint potential of the signal lines 3P and 3N during the steady state.

The following describes an operation of the above configuration.

In this case, the transmission line 3 transmits a binary signal having a high level or a low level as a differential signal. For example, when the power supply is 5V, the signal lines 3P and 3N are set at 2.5V as an intermediate potential at a non-driven state. The differential voltage is 0V, and the differential signal is at a low level representing the recessive level. The intermediate potential corresponds to the midpoint potential of the signal lines 3P and 3N.

When the transmission circuit (not shown) in the communication circuit 6 drives the transmission line 3, the signal line 3P is driven at, for example, 3.5V or higher, and the signal line 3N is driven at, for example, 1.5V or lower. The differential voltage is 2V or higher, and the differential signal is at the high level representing the dominant level. Although it is not shown, both ends of the signal lines 3P and 3N are terminated with a terminating resistor of 120Ω. When the signal level of the differential signal is changed from the high level to the low level, the transmission line 3 is at the non-driven state and the impedance of the transmission line 3 gets larger. Thus, ringing occurs in the waveform of the differential signal.

The ringing suppression circuit 5 controls the suppressor 7 to start the suppression operation by turning on the transistors T4 and T5 when the signal level of the differential signal is changed from the high level to the low level representing the recessive level as a trigger circumstance. This operation is achieved as described in the following. When the level of the differential signal is at the high level, since the transistors T1, T3 are turned on, the transistor T2 is turned off. Accordingly, both of the transistors T4 and T5 are at an off state.

From the situation as descried above, when the signal level of the differential signal is changed from the high level to the low level, since the transistors T1, T3 are turned off, the transistors T4 and T5 are turned on. The signal lines 3P and 3N are connected through the on-resistance of the transistor T4 and the on-resistance of the transistor T5 so that the impedance is lowered. Accordingly, the energy of the waveform distortion is consumed by the on-resistance so that the ringing is suppressed. The waveform distortion occurs at a falling edge of the differential signal. The falling edge of the differential signal refers to a situation where the signal level is changed from the high level to the low level.

According to the present embodiment described above, the following effects can be attained.

Figure 5:
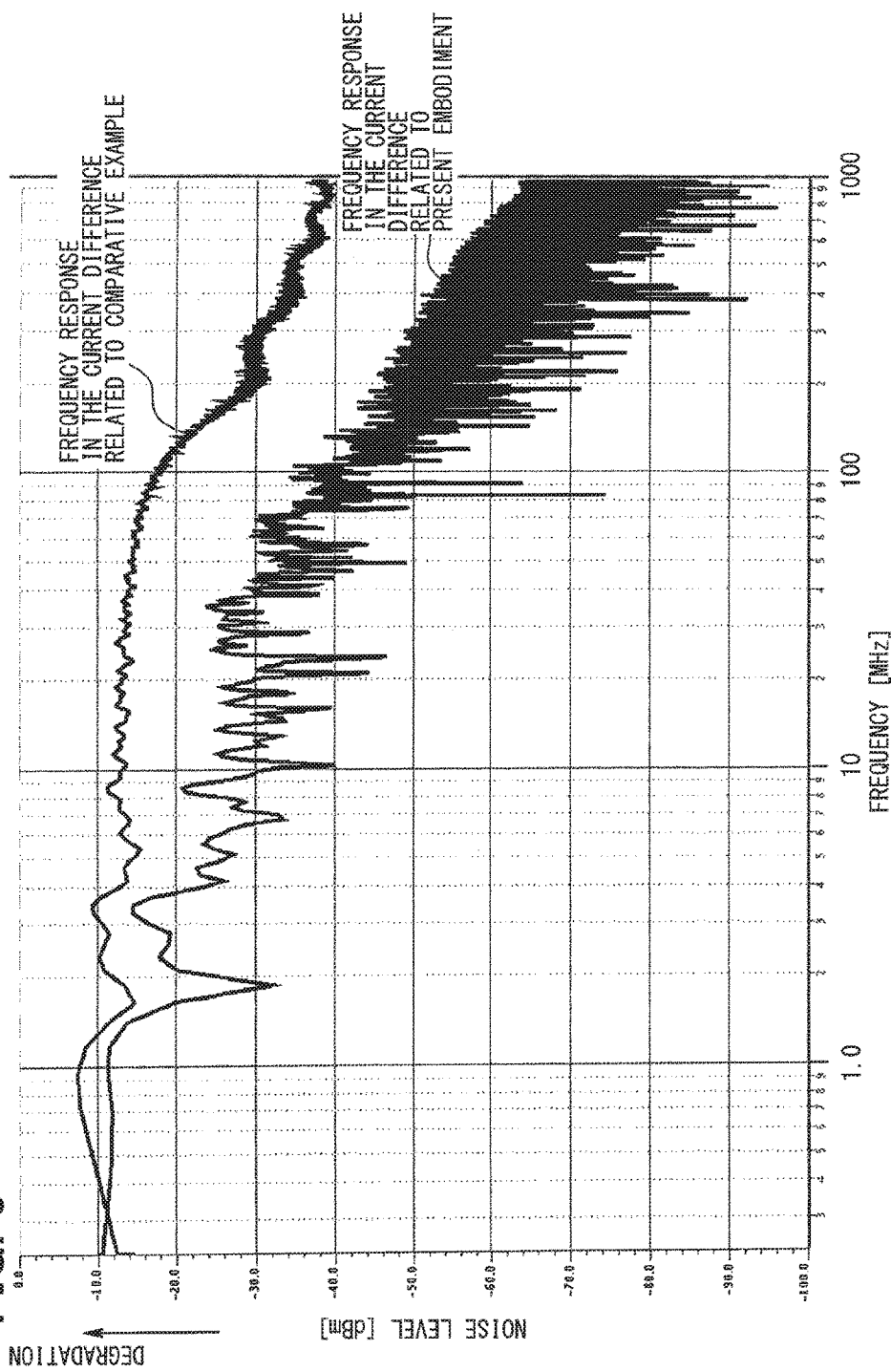
FIG. 5 is a drawing that schematically illustrates the frequency responses of current noises as the simulation results respectively related to the operation of a ringing suppression circuit according to the first embodiment and the operation of the ringing suppression circuit according to the comparative example.

The effect attained in the present embodiment can be further clarified by comparing with a typical configuration (hereinafter referred to as "comparative example") where the potential is not fixed at the intermediate point of the resistive component to be connected between the signal lines 3P and 3N during the suppression operation. The following describes the comparison between the present embodiment and the comparative example while describing the effects attained by the present embodiment with reference to FIGS. 4 and 5. Each of FIGS. 4 and 5 illustrates the simulation result of the circuit operation in the comparative example and the simulation result of the circuit operation in the present embodiment.

When the suppression operation is performed, the resistive component is connected between the signal lines 3P and 3N. With regard to the comparative example where the potential at the intermediate point of the resistive component is not fixed, when the common-mode noise is superimposed on the on-going suppression operation, the midpoint potential of the signal lines 3P and 3N gets unstable due to the influence of noise.

For example, as illustrated in FIG. 4, in the comparative example, the reference point of the differential signal, that is, the midpoint potential of the signal lines 3P and 3N is in oscillation, and the midpoint potential is to be a value, which fluctuates significantly from the original value (2.5V). In the vicinity of the largest fluctuation portion of the midpoint potential, a large potential difference occurs between the signal lines 3P and 3N, and thus the current difference between the signal lines 3P and 3N is to be a large value. It takes a relatively longer time until the midpoint potential, which fluctuates significantly as described above, returns to the value of the midpoint potential during the steady state (2.5V=Vcc/2).

In contrast, with regard to the ringing suppression circuit 5 in the present embodiment, the reference potential Vm corresponding to the value of the midpoint potential during the steady state is provided to the intermediate point of the resistive component. As shown in FIG. 4, in a situation where the common-mode noise is superimposed during the suppression operation, although the midpoint potential of the signal lines 3P and 3N fluctuates due to the influence of noise, the fluctuation is suppressed to a smaller scale as compared with the comparative example.

In this case, since a large potential difference does not occur between the signal lines 3P and 3N, the current difference between the signal lines 3P and 3N is a significantly small value as compared with the comparative example. In this case, the fluctuated midpoint potential of the signal lines 3P and 3N returns to the reference potential Vm, that is, the original value (2.5V) within a significantly short time as compared with the comparative example.

According to the present embodiment, even when the common-mode noise is superimposed during the suppression operation for ringing suppression, the advantageous effect in stabilizing the voltage level of the signal lines 3P and 3N can be attained.

In the comparative example, when the common-mode noise is continuously superimposed, the fluctuation of the midpoint potential of the signal lines 3P and 3N gradually gets larger, and thus a large potential difference occurs between the signal lines 3P and 3N. Therefore, the current difference also gets larger. In contrast, with regard to the present embodiment, even when the common-mode noise is continuously superimposed, the midpoint potential of the signal lines 3P and 3N returns to the original value (the midpoint potential during the steady state) within a relatively short time. A large potential difference is not generated between the signal lines 3P and 3N, and thus the current difference is to be a smaller value.

As illustrated in FIG. 5, with regard to the ringing suppression circuit 5 according to the present embodiment, the current difference of the signal lines 3P and 3N, that is the current noise level, is suppressed to a smaller value as compared with the comparative example. According to the present embodiment, the effect in improving the frequency response of current noise can be attained with respect to the comparative example.

The reference potential provider 9 includes the voltage follower so that the impedance conversion is performed between the input and output of the voltage follower. It is possible to set a relatively high value for the respective resistance values of the resistors R4 and R5. Thus, it is possible to enhance the accuracy and stability of the reference potential Vm to be output while suppressing the current consumption to a smaller value.

Second Embodiment

A second embodiment will hereinafter be described with reference to FIGS. 6 and 7.

The present embodiment illustrates another particular configuration of the reference potential provider.

Figure 6:
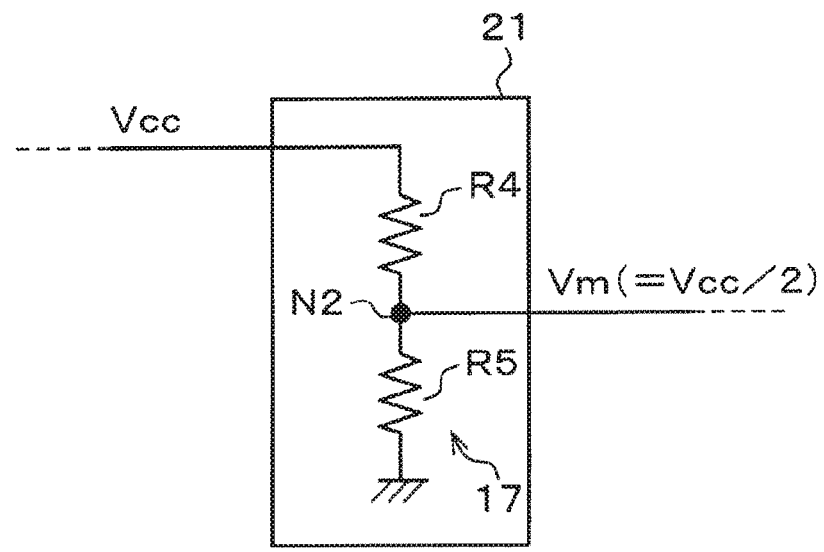
FIG. 6 is a drawing that schematically illustrates another configuration (the first example) of a reference potential provider according to a second embodiment.

FIG. 6 illustrates a reference potential provider 21 with a simplified configuration with respect to the reference potential provider 9 illustrated in FIG. 3. In this case, the operational amplifier 16 is omitted. The mutual connection node N2 between the resistors R4 and R5 is to be the output terminal of the reference potential Vm. Even with such a configuration, since it is possible to provide the reference potential Vm to the intermediate point of the resistive component to be connected between the signal lines 3P and 3N, it is possible to attain the same function and effect as in the first embodiment. Furthermore, it is possible to attain the effect in simplifying the circuitry configuration.

Figure 7:
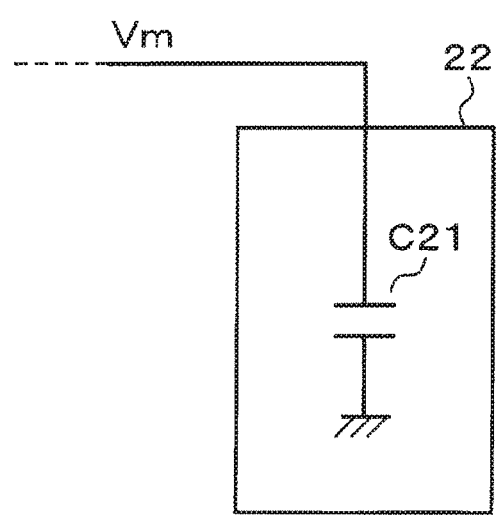
FIG. 7 is a drawing that schematically illustrates another configuration (the second example) of a reference potential provider according to the second embodiment.

FIG. 7 illustrates the reference potential provider 22 configured by a capacitor C21. In this case, one of the terminals of the capacitor C21 is the output terminal of the reference potential Vm, and is to be connected to the mutual connection node N1 as the intermediate point of the resistive component. The other terminal of the capacitor C21 is to be connected to the ground to which the reference potential of the circuit is to be provided.

In such a configuration, when the resistive component is connected between the signal lines 3P and 3N, the charging of the capacitor C21 is performed during the steady state in which the common-mode noise is not superimposed. The potential of the one terminal of the capacitor C21 is to be at the reference potential Vm as the midpoint potential of the signal lines 3P and 3N during the steady state. In other words, according to the above-mentioned configuration, the charging of the capacitor C21 is performed during the steady state, and thus the reference potential Vm is provided to the mutual connection node N1.

With such a configuration, when the common-mode noise is superimposed during the execution of the suppression operation, the midpoint potential between the signal lines 3P and 3N fluctuates due to the influence of noise; however, the capacitor C21 is connected to the mutual connection node N1 as the intermediate point of the resistive component, and thus the fluctuation is suppressed to a smaller scale. Even with such a configuration, the present embodiment also attains the same function and effects as those of the first embodiment.

In this configuration, the charging of the capacitor C21 is performed through the resistive component connected between the signal lines 3P and 3N, and thus the reference potential Vm is automatically provided to the intermediate point of the resistive component. The reference potential Vm corresponds to the midpoint potential of the signal lines 3P and 3N during the steady state. Accordingly, it is possible to set a desirable value for the reference potential Vm (for example, the midpoint potential of the signal lines 3P and 3N during the steady state) to be provided in higher accuracy without having strict design such as a circuit constant.

Third Embodiment

Figure 8:
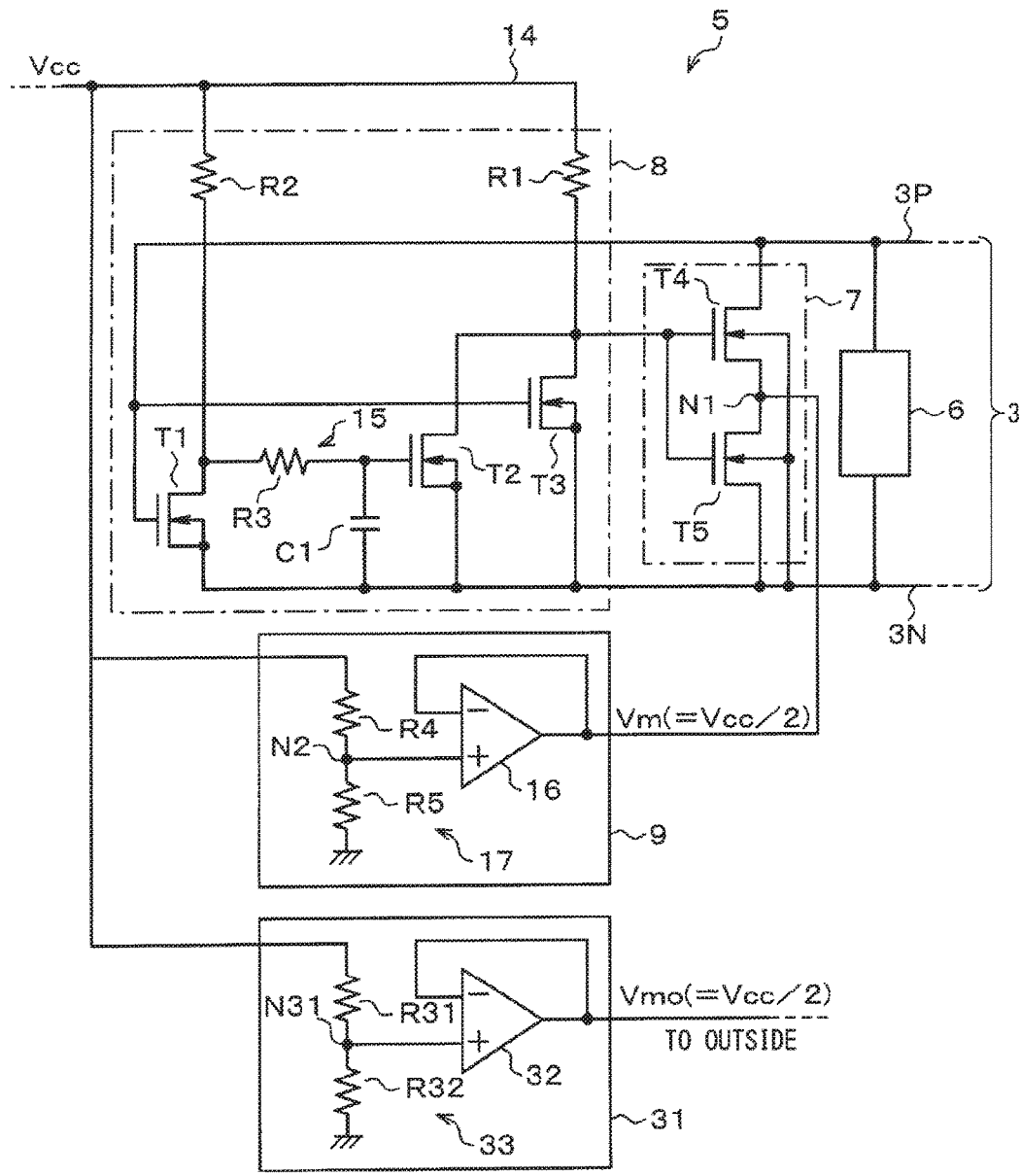
FIG. 8 is a drawing that schematically shows a particular configuration of a ringing suppression circuit according to a third embodiment.

The following describes a third embodiment with reference to FIG. 8.

As illustrated in FIG. 8, a reference potential generator 31 is provided at the node 2. The reference potential generator 31 includes the resistors R31 and R32 and an operational amplifier 32 corresponding to a buffer circuit, and it is similar to the configuration of the reference potential provider 9. In other words, the resistors R31 and R32 are connected in series between the power supply line 14 and the ground. The resistors R31 and R32 constitute a dividing circuit 33 for dividing the power supply voltage Vcc. The resistivity ratio of the resistor R31 with respect to the resistor R32 is set to be 1:1. The mutual connection node N2 between the resistors R31 and R32 is connected to a non-inverting input terminal of the operational amplifier 32. An inverting input terminal of the operational amplifier 32 is connected to the output terminal of the operational amplifier 32.

With such a configuration, the reference potential generator 31 is configured to output a divided voltage (=Vcc/2) through the voltage follower. The divided voltage is obtained by dividing the power supply voltage Vcc through the resistors R31 and R32. In this case, the output voltage of the reference potential generator 31 is output to outside.

Thus, the reference potential generator 31 is provided at the node 2, and originally generates a reference potential Vmo (=Vcc/2) corresponding to the midpoint potential of the signal lines 3P and 3N during the steady state. Although it is not shown, the reference potential provider 9 may be omitted, and the reference potential Vmo generated by the reference potential generator 31 may be provided to the intermediate point of the resistive component. Therefore, a reduction in the circuitry size can be achieved by eliminating the need of separately providing the reference potential provider 9.

However, in the present embodiment, the reference potential provider 9 having the same configuration is arranged separately from the reference potential generator 31 originally arranged, and the reference potential provider 9 provides the reference potential Vm to the intermediate point of the resistive component. With such a configuration, the reference potential Vm can be provided to the intermediate point of the resistive component without having influence on, for example, the state of an external circuit to which the output voltage of the reference potential generator 31 is to be provided.

Fourth Embodiment

The following describes a fourth embodiment with reference to FIGS. 9 to 12.

The present embodiment shows another particular example for configuring the suppressor.

Figure 9:
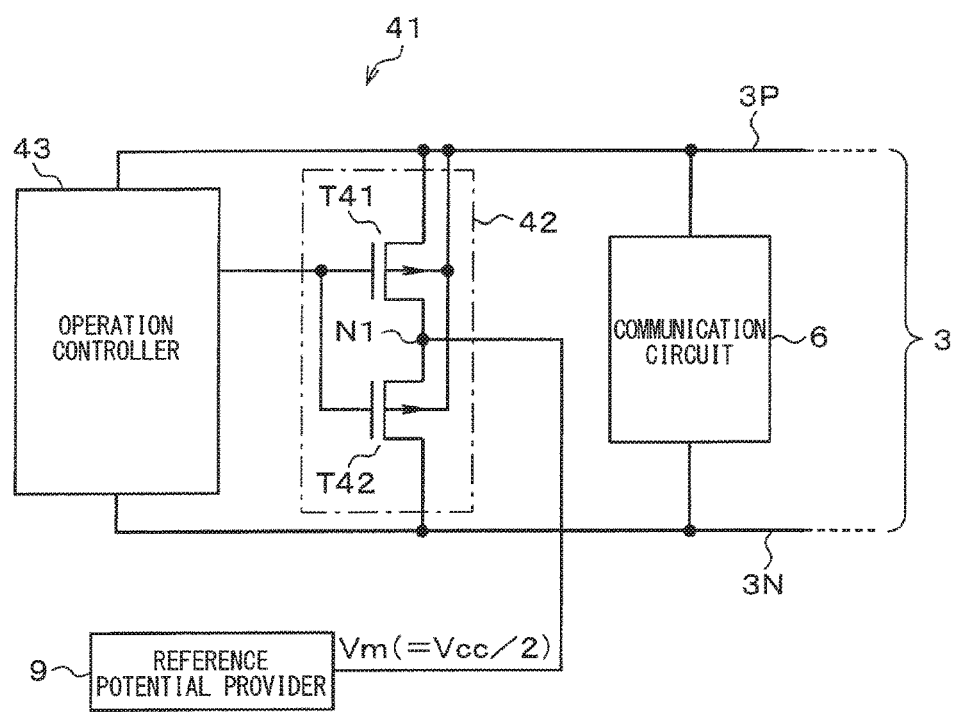
FIG. 9 is a drawing that schematically shows a configuration (the first example) of a suppressor according to a fourth embodiment.

A suppressor 42 of the ringing suppression circuit 41 illustrated in FIG. 9 is different from the suppressor 7 illustrated in FIG. 3 such that the suppressor 42 includes transistors T41 and T42 as p-channel MOSFETs in replacement of the transistors T4 and T5. The source of the transistor T41 is connected to the signal line 3P, and the drain of the transistor T41 is connected to the source of the transistor T42. The drain of the transistor T42 is connected to the signal line 3N.

In other words, both of the transistors T41 and T42 are connected in series between the signal lines 3P and 3N. The respective back-gates of the transistors T41 and T42 are connected to the signal line 3R The value of the on-resistance of the transistor T41 and the value of the on-resistance of the transistor T42 are equal. In this case, the mutual connection node N1 between the transistors T41 and T42 corresponds to the intermediate point of the resistive component.

An operation controller 43 may be configured to perform the same operation as the operation controller 8. That is, the operation controller 43 controls the suppressor 42 to start the suppression operation by turning on the transistors T41 and T42 when the signal level of the differential signal is changed from the high level to the low level indicated as the recessive level as a trigger circumstance. For example, a configuration of a second suppression circuit 1P, which is illustrated in FIG. 6 of JP 2012-257205 A, excluding a transistor 7P may be utilized as the operation controller 43. Even with such a configuration, the present embodiment also attains the same function and effects as those of the first embodiment.

Figure 10:
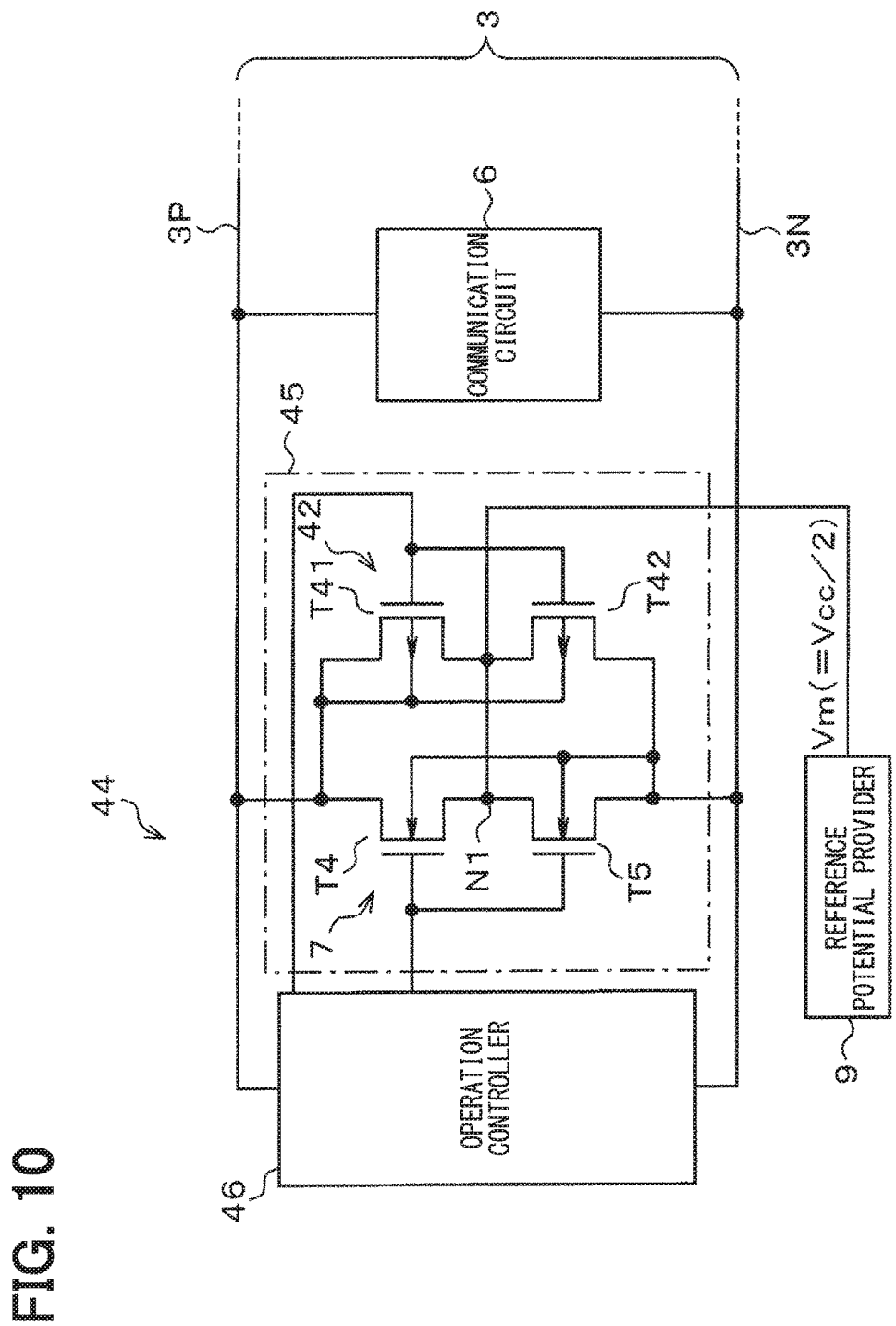
FIG. 10 is a drawing that schematically shows a configuration (the second example) of the suppressor according to the fourth embodiment.

A suppressor 45 of a ringing suppression circuit 44 illustrated in FIG. 10 is a combination of the suppressor 7 illustrated in FIG. 3 and the suppressor 42 illustrated in FIG. 9. That is, the suppressor 45 is configured such that the suppressor 7 and the suppressor 42 are connected in parallel between a pair of the transmission lines 3.

In this case, the operation controller 46 may be configured to perform the same operation as the operation controllers 8 and 43. That is, the operation controller 46 controls the suppressor 45 to start the suppression operation by turning on the transistors T4, T5, T41 and T42 when the signal level of the differential signal is changed from the high level to the low level representing the recessive level as a trigger circumstance. For example, a configuration of first and second suppression circuits 1N and 1P, which are illustrated in FIG. 6 of JP 2012-257205 A, excluding transistors 7N and 7P may be utilized as the operation controller 46.

Even with such a configuration, the present embodiment also attains the same function and effects as those of the first embodiment. Further, according to the above-described arrangement, the following effects can be obtained. That is, the supply voltage Vcc is set at, for example, 5V with reference to the ground level of the node 2 provided with the ringing suppression circuit 44. On the other hands, the high level and low level of the differential signal to be transmitted through a pair of the transmission lines 3 are decided according to the ground level of the node 2 at a transmission end, which drives the transmission line 3.

In a situation where the nodes 2 are arranged at respective parts of a vehicle such as the transmission line 3 of in-vehicle LAN, it is assumed that the voltages of the respective grounds of the nodes 2 are different. According to the above-mentioned configuration, even when a ground offset is present among the nodes 2, at least one of the suppressors 7 and 42 are robustly in operation, and thus the ringing suppression effects can be robustly attained.

Figure 11:
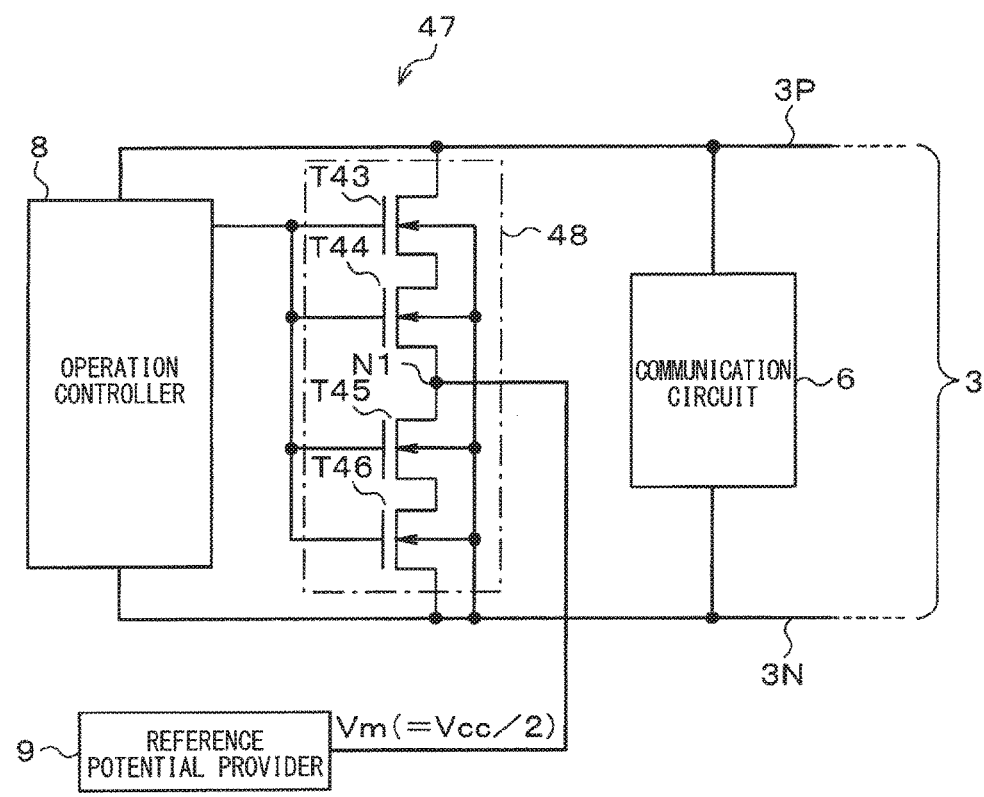
FIG. 11 is a drawing that schematically shows a configuration (the third example) of the suppressor according to the fourth embodiment.

A suppressor 48 of a ringing suppression circuit 47 illustrated in FIG. 11 is different from the suppressor 7 illustrated in FIG. 3 such that the suppressor 48 includes transistors T43 to T46 as n-channel MOSFETs in replacement of the transistors T4 and T5. In this case, the drain of the transistor T43 is connected to the signal line 3P, and the source of the transistor T43 is connected to the drain of the transistor T44.

The source of the transistor T44 is connected to the drain of the transistor T45, and the source of the transistor T45 is connected to the drain of the transistor T46. The source of the transistor T46 is connected to the signal line 3N. That is, the four transistors T43 to T46 are connected in series between the signal lines 3P and 3N. The respective back-gates of the transistors T43 to T46 are connected to the signal line 3N. In this case, the mutual connection node N1 between the transistors T44 and T45 corresponds to the intermediate point of the resistive component.

The combined series resistance obtained by the respective on-resistance values of the transistors T43 and T44 and the combined series resistance obtained by the respective on-resistance values of the transistors T45 and T46 are equal. That is, the respective on-resistance values of the transistors T43 to T46 are set to satisfy the following expression (1). The respective on-resistance values of the transistors T43 to T46 are denoted by Ron43 to Ron46.

$$Ron43+Ron44=Ron45+Ron46 \quad (1)$$

Even with such a configuration, the present embodiment also attains the same function and effects as those of the first embodiment.

Figure 12:
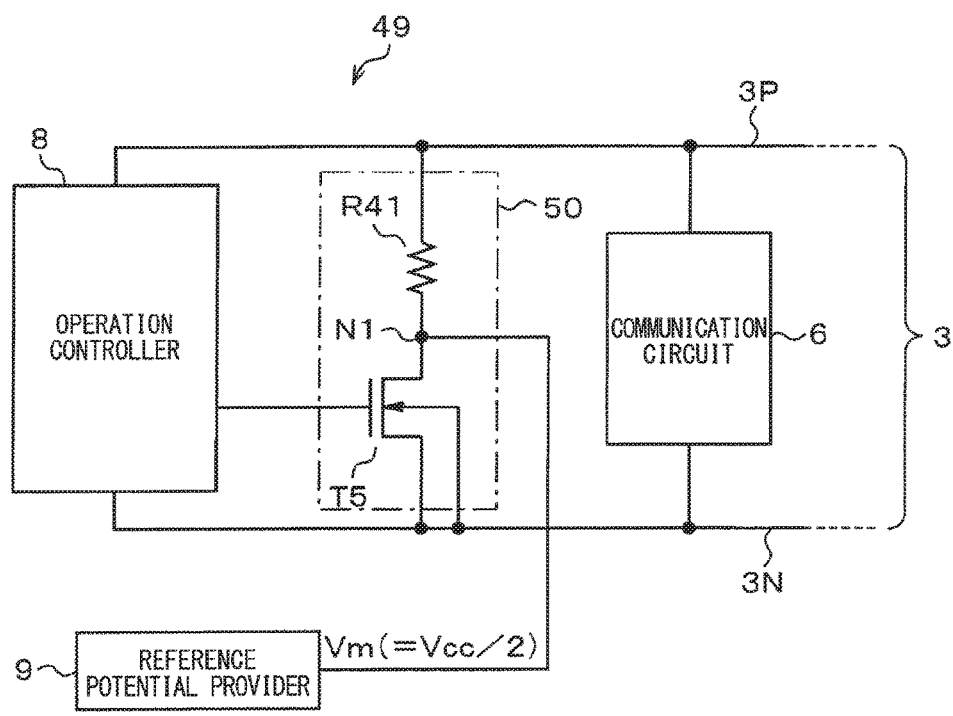
FIG. 12 is a drawing that shows a configuration (the fourth example) of the suppressor according to the fourth embodiment.

A suppressor 50 of a ringing suppression circuit 49 illustrated in FIG. 12 is different from the suppressor 7 illustrated in FIG. 3 such that the suppressor 50 includes a resistor R41 in replacement of the transistor 14. One of the terminals of the resistor R41 is connected to the signal line 3P, and the other terminal of the resistor R41 is connected to the drain of the transistor T5. That is, the resistor R41 and the transistor T5 are connected in series between the signal lines 3P and 3N.

In this case, the resistor R41 functions as the resistor 10, and the on-resistance of the transistor T5 functions as the resistor 11. That is, the resistive component is configured by the resistor R41 and the on-resistance of the transistor 15. The switching operation of the transistor T5 functions as the switches 12 and 13.

It is noted that the resistance value of the resistor R41 is set to be equal to the on-resistance value of the transistor T5. The mutual connection node N1 between the resistor R41 and the transistor T5 corresponds to the intermediate point of the resistive component. Even with such a configuration, the present embodiment also attains the same function and effects as those of the first embodiment.

Other Embodiments

The present disclosure is not limited to the embodiments that have been described above and illustrated in the drawings, but can arbitrarily be modified, combined, or expanded without departing from the gist of the present disclosure.

The particular configuration of the suppressor may be properly modified as long as a resistive component is connected between the signal lines 3P and 3N for performing the suppressing operation for ringing suppression.

For example, three, five or more transistors may be connected in series between the signal lines 3P and 3N for configuring the suppressor. In this case, the respective on-resistance values of the transistors may be set to satisfy a condition in which the combined series on-resistance values of the transistors to be connected between the signal line 3P and a node provided with the reference potential Vm (the intermediate point of the resistive component) and the combined series on-resistance values of the transistors to be connected between the node and the signal line 3N are equal. In this case, the transistor may be either an n-channel MOSFET or a p-channel MOSFET.

With regard to the suppressor 50 illustrated in FIG. 12, the respective connection positions of the resistor R41 and the transistor T5 may be interchanged. Furthermore, in this case, a plurality of transistors, which are in replacement of the transistor T5, may be connected in series.

The particular configuration of the reference potential provider may be properly modified as long as the reference potential can be provided to the intermediate point of the resistive component to be connected between the signal lines 3P and 3N.

The communication protocol is not limited to CAN. Any protocol is applicable as long as it transmits a differential signal through a pair of communication lines.

Although the disclosure has been described in accordance with the embodiments, it is understood that the present disclosure is not limited to the above embodiments or structures. Various changes and modification may be made in the present disclosure. In addition, various combinations and configurations, as well as other combinations and configurations that include only one element, more, or less, fall within the scope and spirit of the present disclosure.

The invention claimed is:

1. A ringing suppression circuit provided at a node having a communication circuit executing communication with another node by transmitting a differential signal through a pair of communication lines, the ringing suppression circuit comprising:
   a suppression circuit configured to perform a suppression operation to suppress ringing occurred with a transmission of the differential signal by connecting a resistive component between the pair of communication lines; and
   a reference potential providing circuit configured to provide a reference potential, which corresponds to a midpoint potential of the pair of communication lines during a steady state, to an intermediate point of the resistive component.

2. The ringing suppression circuit according to claim 1, wherein the resistive component includes on-resistance of a MOSFET.

3. The ringing suppression circuit according to claim 1, wherein the resistive component includes a resistor.

4. The ringing suppression circuit according to claim 1, wherein:
   the reference potential providing circuit includes a dividing circuit, which divides a predetermined power supply voltage; and
   the reference potential refers to a voltage corresponding to a divided voltage obtained by dividing the predetermined power supply voltage through the dividing circuit.

5. The ringing suppression circuit according to claim 4, wherein:
   the reference potential providing circuit further includes a buffer circuit configured to receive an input of the divided voltage; and
   the reference potential refers to an output voltage of the buffer circuit.

6. The ringing suppression circuit according to claim 1, wherein:
   the reference potential providing circuit includes a capacitor connected between the intermediate point and a ground to which a reference potential of a circuit is to be provided.

7. The ringing suppression circuit according to claim 1, wherein:
   the node includes a reference potential generating circuit configured to generate the reference potential; and
   the reference potential providing circuit is provided by the reference potential generating circuit.

8. A ringing suppression circuit provided at a node having a communication circuit executing communication with another node by transmitting a differential signal through a pair of communication lines, the ringing suppression circuit comprising:
   a suppressor that includes a resistive component, and that is configured to connect the resistive component with the pair of communication lines to suppress ringing occurred with a transmission of the differential signal; and
   a reference potential provider configured to provide a reference potential, which corresponds to a midpoint potential of the pair of communication lines during a steady state, to an intermediate point of the resistive component.

* * * * *